US008592953B2

(12) United States Patent
Ahn et al.

(10) Patent No.: US 8,592,953 B2
(45) Date of Patent: *Nov. 26, 2013

(54) STRUCTURES INCLUDING PASSIVATED GERMANIUM (71) Applicant: Round Rock Reseach, LLC, Jersey City, NJ (US)

(72) Inventors: Kie Y. Ahn, Chappaqua, NY (US); Leonard Forbes, Corvallis, OR (US)

(73) Assignee: Round Rock Research, LLC, Jersey City, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/740,399

(22) Filed: Jan. 14, 2013

(65) Prior Publication Data

US 2013/0153902 A1 Jun. 20, 2013

Related U.S. Application Data

(60) Continuation of application No. 13/072,182, filed on Mar. 25, 2011, now Pat. No. 8,354,738, which is a continuation of application No. 12/120,013, filed on May 13, 2008, now Pat. No. 7,915,712, which is a division of application No. 11/122,798, filed on May 5, 2005, now Pat. No. 7,422,966.

(51) Int. Cl.
*H01L 29/06* (2006.01)

(52) U.S. Cl.
USPC ............. 257/626; 257/E21.116; 257/E23.132

(58) Field of Classification Search
USPC ..................... 257/626, E21.116, E23.132
See application file for complete search history.

(56) References Cited

U.S. PATENT DOCUMENTS

| 4,589,006 A | 5/1986 | Hansen et al. |
| 4,735,699 A | 4/1988 | Wort et al. |
| 4,740,442 A | 4/1988 | Waddell et al. |
| 4,745,041 A | 5/1988 | Komatsu et al. |
| 6,380,601 B1 | 4/2002 | Ermer et al. |
| 6,794,255 B1 | 9/2004 | Forbes et al. |
| 6,844,070 B2 | 1/2005 | Johnson et al. |
| 7,915,712 B2 | 3/2011 | Forbes et al. |
| 2005/0112048 A1 | 5/2005 | Tsakalakos et al. |
| 2005/0211988 A1 | 9/2005 | Leycuras |

FOREIGN PATENT DOCUMENTS

| AT | 175118 T | 1/1999 |
| JP | 79-002542 | 2/1979 |
| JP | 62-098361 A | 5/1987 |

OTHER PUBLICATIONS

Booth et al., "The Optical and Structural Properties of CVD Germanium Carbide," Journal De Physique, 42(C-4), 1981, pp. 1033-1036.
Chen et al., "Electrical Properties of Si.sub.1-x-y Ge.sub.xC.sub.y and Ge.sub.1-yC.sub.y Alloys," Journal of Electronic Materials, vol. 26, No. 12, 1997, pp. 1371-1375.
Dalai et al., "Microcrystalline Germanium Carbide-A New Material for PV Conversion," Proceedings of the 2001 NCPV Program Review Meeting, Oct. 2001, pp. 348-349.

(Continued)

*Primary Examiner* — Asok K Sarkar
(74) *Attorney, Agent, or Firm* — Lerner, David, Littenberg, Krumholz & Mentlik, LLP (57) ABSTRACT

A passivated germanium surface that is a germanium carbide material formed on and in contact with the germanium material. A semiconductor device structure having the passivated germanium having germanium carbide material on the substrate surface is also disclosed.

16 Claims, 4 Drawing Sheets

(56) References Cited

OTHER PUBLICATIONS

Herrold et al., "Growth and Properties of Microcrystalline Germanium-Carbide Alloys Grown Using Electron Cyclotron Resonance Plasma Processing," Journal of Non-Crystalline Solids, vol. 270, 2000, pp. 255-259.

Herrold et al., "Growth and Properties of Microcrystalline Germanium-Carbide Alloys," Mat. Res. Soc. Symp. Proc. vol. 557, Materials Research Society, 1999, pp. 561-566.

Kelly et al., "Application of Germanium Carbide in Durable Multilayer IR Coatings," SPIE, vol. 1275, Hard Materials in Optics, 1990, pp. 122-134.

Kumru, Mustafa, "A Comparison of the Optical, IR, Electron Spin Resonance and Conductivity Properties of a-$Ge_{1-x}C_x$:H with a a-Ge:H and a-Ge Thin Films Prepared by R.F. Sputtering," Thin Solid Films, 198, 1991, pp. 75-84.

Liu et al., "Structure and Properteis of Germanium Carbide Films Prepared by RF Reactive Sputtering in Ar/$CH_4$," Japanese Journal of Applied Physics, vol. 36, Part 1, No. 6A, Jun. 1997, pp. 3625-3628.

Mahan et al., "On the Influence of Short and Medium Range Order on the Material Band Gap in Hydrogenated Amorphous Silicon," Journal of Applied Physics, vol. 96, No. 7, Oct. 1, 2004, pp. 3818-3826.

Meyerson, Bernard S., "High-Speed Silicon-Germanium Electronics," Scientific American, Mar. 1994, pp. 62-67.

Rizzoli et al., "Wide Band-Gap Silicon-Carbon alloys Deposited by Very High Frequency Plasma Enhanced Chemical Vapor Deposition," Journal of Applied Physics, vol. 96, No. 7, Oct. 1, 2004, pp. 3987-3997.

Shinar et al., "An IR, Optical, and Electron-Spin-Resonance Study of As-Deposited and Annealed a-$Ge_{1-x}C_x$:H Prepared by RF Sputtering in Ar/$H_2$/$C_3H_8$," Journal of Applied Physics, 62 (3), Aug. 1, 1987, pp. 808-812.

Shinar et al., "Electron Energy-Loss Studies on Radio Frequency Sputtered a-$Ge_{1-x}C_x$:H Films," Journal of Vacuum Science and Technology a 5 (5), Sep./Oct. 1987, pp. 2804-2808.

Shinar, Ruth, "Hydrogen Adsorption on Some a-$Ge_{1-x}C_x$:H Films Prepared by Radio-Frequency Sputtering," Journal of Vacuum Science and Technology A 6 (5), Sep./Oct. 1988, pp. 2910-2913.

Tyczkowski et al., "Electronic Band Structure of Insulating Hydrogenated Carbon-Germanium Films," Journal of Applied Physics, vol. 86, No. 8, Oct. 15, 1999, pp. 4412-4418.

Vetter et al., "IR-Study of a-$SiC_x$:H and a-$SiC_{xn_y}$:H Films for c-Si Surface Passivation," Thin Solid Films vol. 451-452, 2004, pp. 340-344.

Yu et al., "Asymmetric Electron Spins Resonance Signals in Hydrogenated Amorphous Germanium Carbide Films," Phys. Stat. Sol. (b), 172, 1992, pp. K1-K5.

STRUCTURES INCLUDING PASSIVATED GERMANIUM

CROSS-REFERENCE TO RELATED APPLICATIONS

This application is a continuation of U.S. application Ser. No. 13/072,182, filed on Mar. 25, 2011, which is scheduled to issue as U.S. Pat. No. 8,354,738 on Mar. 7, 2013, which is a continuation of U.S. patent application Ser. No. 12/120,013, filed on May 13, 2008, which issued as U.S. Pat. No. 7,915,712 on Mar. 29, 2011, which application is a divisional of U.S. application Ser. No. 11/122,798, filed on May 5, 2005, issued as U.S. Pat. No. 7,422,966 on Sep. 9, 2008, the disclosures of which are incorporated herein by reference.

BACKGROUND OF THE INVENTION

1. Field of the Invention

The present invention relates to a method of passivating germanium. More specifically, the present invention relates to a method of carburizing germanium to form germanium carbide.

2. State of the Art

One significant reason for the wide use of silicon, rather than germanium, as a semiconductor substrate is the ease with which silicon is passivated. The silicon oxidizes, producing silicon dioxide, which is a good electrical insulator and passivator. The silicon dioxide also acts as a barrier, preventing impurities from penetrating the silicon without affecting the properties of the silicon. Alloys of silicon and germanium are used in high-speed bipolar transistor structures in high frequency wireless radio frequency ("RF") circuits. In addition, alloys of silicon, carbide, and germanium are used in high-power, high temperature semiconductor devices. However, in many applications, such as in high speed devices, germanium is a more suitable semiconductor substrate than silicon or silicon alloys because the electron mobility of germanium is higher. Germanium also has a direct transition that is only slightly higher in energy than the indirect band gap. As a consequence, germanium has a higher absorption coefficient than silicon, making germanium desirable in many optoelectronic or photovoltaic applications.

While germanium also forms a native oxide, germanium oxide is a poor insulator, is soluble in water and other solvents typically used to process semiconductor devices, and is volatile at elevated temperatures typically used to process the semiconductor devices. Therefore, germanium oxide is not a good passivator for a germanium surface. As disclosed in U.S. Pat. No. 4,589,006 to Hansen et al., a diode formed from a germanium substrate is passivated with a layer of hydrogenated amorphous germanium or hydrogenated amorphous silicon. The layer is formed by sputtering the germanium or silicon in a low pressure atmosphere of hydrogen and a noble gas.

Hydrogenated amorphous silicon is a widely studied material. It has been determined that the band gap energy of the hydrogenated amorphous silicon depends on the degree of short range order in the material. The band gap energies of amorphous materials are not well defined or well known but are generally higher than those of corresponding crystalline materials. For instance, the band gap of crystalline silicon is 1.2 eV but that of amorphous silicon is up to 2.0 eV.

U.S. Pat. No. 6,794,255 to Forbes et al., which is commonly assigned to the assignee of the present invention, discloses forming silicon carbide by carburizing silicon. The resulting silicon carbide is preferably amorphous. The silicon is carburized using microwave plasma-enhanced chemical vapor deposition ("MPECVD"). The silicon carbide is used as an insulating dielectric layer in a field effect transistor ("FET").

Figure 1:
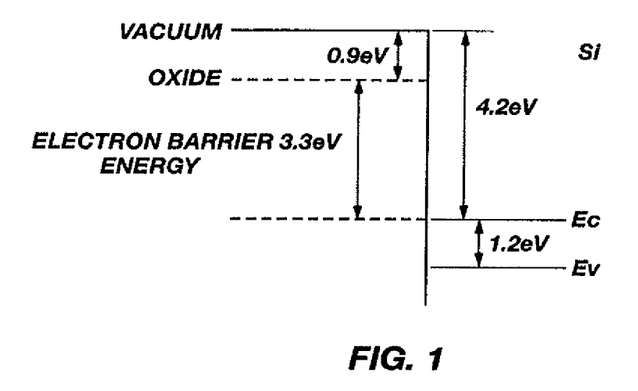
FIG. 1 is a band diagram for silicon.
Figure 2:
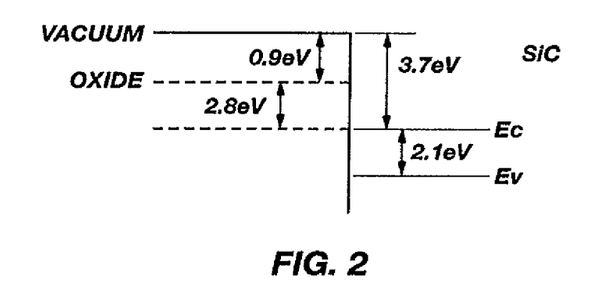
FIG. 2 is a band diagram for silicon carbide.

Band diagrams for crystalline silicon and crystalline silicon carbide are shown in FIGS. 1 and 2, respectively. The band gap of crystalline silicon is 1.2 eV, the electron affinity is 4.2 eV, and the electron barrier energy is 3.3 eV while the band gap of crystalline silicon carbide is 2.1 eV, the electron affinity is 3.7 eV, and the electron barrier energy is 2.8 eV. In contrast, amorphous hydrogenated silicon carbide deposited by very high frequency plasma enhanced chemical vapor deposition has a band gap of up to 3.4 eV. As such, the amorphous hydrogenated silicon carbide has a greater band gap than that of the crystalline silicon carbide (2.1 eV). The amorphous silicon carbide deposited on silicon has been shown to have a low surface recombination velocity and provides good passivation on silicon.

Germanium carbide films have been deposited or grown by chemical vapor deposition ("CVD"), plasma assisted CVD, molecular beam epitaxy ("MBE"), glow-discharge decomposition, RF reactive sputtering, or electron cyclotron resonance ("ECR") plasma processing. Electrical and optical properties of the resulting films depend on the process of preparing the germanium carbide films and the processing conditions that are used. Booth et al., "The Optical and Structural Properties of CVD Germanium Carbide," J. de Physique, 42(C-4) 1033-1036 (1981) discloses forming germanium carbide films by CVD. The germanium carbide films have polycrystalline germanium clusters distributed in a $Ge_yC_z$ material and, therefore, are neither crystalline nor amorphous. As disclosed in Chen et al., "Electrical Properties of $Si_{1-x-y}Ge_xC_y$ and $Ge_{1-y}C_y$ Alloys," Journal of Electronic Materials, 26(12):1371-1375 (1997), $Ge_{1-y}C_y$ alloys that are rich in germanium are deposited on n-type silicon substrates by MBE. The $Ge_{1-y}C_y$ alloys have improved crystalline quality and reduced surface roughness compared to pure germanium. Tyczkowski et al., "Electronic Band Structure of Insulating Hydrogenated Carbon-Germanium Films," Journal of Applied Physics, 86(8):4412-418 (1999) discloses forming hydrogenated carbon-germanium films by plasma assisted CVD from tetramethylgermanium in a RF glow discharge. After annealing, the hydrogenated carbon-germanium films have a band gap energy as high as 7.1 eV and an electron affinity of 1.2 eV.

Amorphous, hydrogenated germanium carbide has been deposited by a variety of techniques. U.S. Pat. No. 4,735,699 to Wort et al., Liu et al., "Structure and Properties of Germanium Carbide Films Prepared by RF Reactive Sputtering in Ar/CH$_4$," Jpn. J. Appl. Phys., 36:3625-3628 (1997), Yu et al., "Asymmetric Electron Spin Resonance Signals in Hydrogenated Amorphous Germanium Carbide Films," Phys. Stat. Sol. B, 172(1):K1-K5 (1992), Shinar et al., "An IR, Optical, and Electron-Spin-Resonance Study of As-deposited and Annealed a-$Ge_{1-x}C_x$:H Prepared by RF Sputtering in Ar/H$_2$/CH$_3$H$_8$," J. Appl. Phys., 62(3):808-812 (1987), M. Kumru, "A Comparison of the Optical, IR, Electron Spin Resonance and Conductivity Properties of a-$Ge_{1-x}C_x$:H with a-Ge:H and a-Ge Thin Films Prepared by R. F. Sputtering," Thin Solid Films, 198:75-84 (1991), and Kelly et al., "Application of Germanium Carbide in Durable Multilayer IR Coatings," SPE Vol 1275 Hard Materials in Optics, (1990) disclose forming amorphous, hydrogenated germanium carbide films on silicon and glass substrates by RF reactive sputtering. The amorphous, hydrogenated germanium carbide films are formed from a germanium target using mixtures of argon and methane or an inert gas and a halocarbon gas. The resulting films are smooth, featureless, and have an amorphous structure. Increasing the carbon content in the amorphous, hydrogenated germanium carbide films increased the hardness of the films. The atomic ratio (Ge/C) of the amorphous, hydrogenated germanium carbide films decreased by increasing the gas flow ratio.

Microcrystalline germanium carbide alloys are disclosed in Herrold et al., "Growth and Properties of Microcrystalline Germanium-Carbide Alloys," Mat. Res. Soc. Symp. Proc., 557:561-566 (1999). The microcrystalline germanium carbide alloys are formed at low temperatures (300° C.-400° C.) on glass, stainless steel, or crystalline silicon substrates by a reactive hydrogen plasma beam deposition technique. The microcrystalline germanium carbide alloys are grown using an ECR reactor. Up to 3% carbon is incorporated into the microcrystalline germanium carbide alloys. The microcrystalline germanium carbide alloys have a high degree of crystallinity and a grain size on the order of a few tens of nm. The best crystallinity is obtained on conducting substrates, indicating the importance of hydrogen ion bombardment in promoting crystallinity. The defect density was low at the tested carbon content. In Herrold et al., "Growth and Properties of Microcrystalline Germanium-Carbide Alloys Grown using Electron Cyclotron Resonance Plasma Processing," Journal of Non-Crystalline Solids, 270:255-259 (2000), higher temperatures (350° C.-400° C.) are used to grow the microcrystalline germanium-carbide alloys with hydrogen dilution and ion bombardment. The microcrystalline germanium-carbide alloys have up to 2% carbon incorporation. Optical absorption curves of the microcrystalline germanium-carbide alloys parallel that of crystalline germanium. In addition, the microcrystalline germanium-carbide alloys have increased band gaps with increasing carbon incorporation. At comparable band gaps, the absorption coefficient of the microcrystalline germanium-carbide alloys is larger than that of crystalline silicon. Microcrystalline hydrogenated germanium carbide films formed by RF reactive sputtering or ECR plasma processing have a low carbon concentration, such as 4%. Therefore, the microcrystalline hydrogenated germanium carbide films have a band gap energy that is close to that of silicon (1.2 eV).

BRIEF SUMMARY OF THE INVENTION

The present invention relates to a method of passivating germanium that comprises providing a germanium material and carburizing at least a portion of the germanium material to form a germanium carbide layer. The germanium carbide layer may be amorphous. The germanium material may be a germanium layer on a substrate or a germanium substrate. The germanium carbide layer may be formed by MPECVD by exposing the germanium material to a microwave generated plasma that is formed from a source gas and hydrogen. The source gas may be a carbon-containing gas selected from the group consisting of ethylene, acetylene, ethanol, a hydrocarbon gas having from one to ten carbon atoms per molecule, and mixtures thereof. In one exemplary embodiment, the source gas may be methane.

The germanium material may be carburized without forming a perceptible or distinct boundary at an interface between the germanium material and the germanium carbide layer. The germanium carbide layer may have an initial thickness that lies within a range of from approximately 10 Å to approximately 500 Å. The thickness of the germanium carbide layer may be increased to lie within a range of from approximately 50 Å to approximately 5000 Å by radio frequency reactive sputtering or electron cyclotron resonance plasma processing.

The present invention also relates to an intermediate semiconductor device structure that comprises a germanium material and a germanium carbide material in contact with at least a portion of the germanium material. The germanium material may be a germanium substrate or a substrate comprising at least one other material, such as, for example, another semiconductor material having a germanium material on a surface thereof. The germanium carbide material may be amorphous and may comprise approximately equal amounts of germanium and carbon. The intermediate semiconductor device structure may be substantially free of a grain boundary in that an interface between the germanium carbide material and the germanium material is substantially free of a distinct or perceptible boundary.

The present invention also relates to a semiconductor device structure, such as a field effect transistor, that comprises a germanium material, a germanium carbide material in contact with at least a portion of the germanium material, and integrated circuitry on a surface of a semiconductor device structure. The germanium material comprises a germanium substrate or a substrate that comprises at least one other material and has a germanium material on a surface thereof. The semiconductor device may be substantially free of a grain boundary between the germanium material and the germanium carbide material. For instance, an interface between the germanium carbide material and the germanium material is substantially free of a distinct boundary. The germanium carbide material may be amorphous germanium carbide and may have a thickness within a range of from approximately 10 Å to approximately 500 Å.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

A method of passivating a germanium material by carburizing the germanium material is disclosed. As used herein, the terms "carburizing," "carburization," "carburized," or other forms thereof refer to incorporating carbon into at least a portion of the germanium material, such as a surface region thereof. The germanium material may be present on a semiconductor device that includes other layers including, by way of example only, integrated circuits that have been previously fabricated thereupon. Forming the layers or integrated circuits on the semiconductor device is known in the art and, therefore, is not described in detail herein. The germanium material may be a substrate formed solely of germanium, a germanium layer on a more robust, insulative carrier substrate, or a germanium layer on a substrate that includes another semiconductor material. Germanium substrates in the form of wafers are known in the art and are commercially available in a variety of nominal diameters, such as 3 inch, 4 inch, 8 inch, and 10 inch diameters. The germanium substrate employed in the present invention may be undoped or may be doped with impurities, as known in the art, to form n+ or p+ doped regions. Alternatively, the germanium material may be a layer of germanium (undoped or doped) that is present on a carrier substrate or a substrate that includes another semiconductor material. As used herein, the phrase "semiconductor substrate" refers to a conventional substrate or other bulk substrate. Thus, the term "bulk substrate" as used herein includes not only germanium wafers, germanium layers on an insulative substrate, and silicon wafers, but also silicon on insulator ("SOI") substrates, such as silicon on glass ("SOG") substrates, silicon on sapphire ("SOS") substrates, epitaxial layers of silicon on a base semiconductor foundation, and other semiconductor materials, such as silicon-germanium, gallium arsenide, or indium phosphide. For the sake of example only, the semiconductor substrate may be a silicon substrate upon which the germanium layer is formed. The germanium layer may be formed on the semiconductor substrate by conventional techniques, such as by CVD or ultra-high vacuum CVD.

Figure 3:
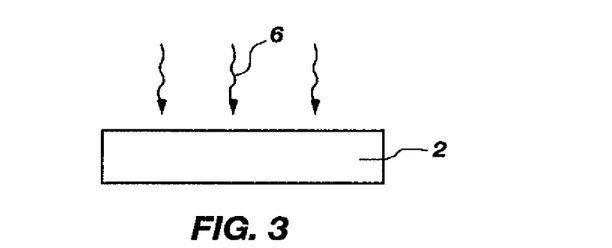
FIGS. 3 and 4 are cross-sectional views of a germanium material and a germanium carbide layer formed on the germanium material.
Figure 4:
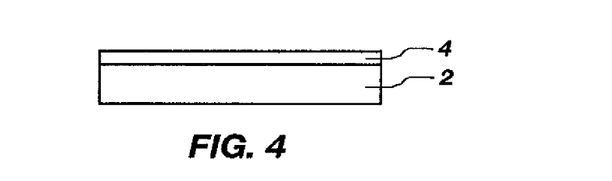

As shown in FIGS. 3 and 4 of the drawings (not drawn to scale), germanium material 2 may be carburized by MPECVD, forming a germanium carbide ("$Ge_xC_{1-x}:H$", where $0<x<1$) layer 4 on a surface of the germanium material 2. The germanium carbide layer 4 formed in this way may be amorphous. Amorphous germanium carbide, rather than crystalline germanium carbide, is preferred because grain boundaries may be present in the crystalline germanium carbide. The crystalline germanium carbide may also lead to charge trapping and diffusion of impurities. MPECVD utilizes a plasma that is produced by an electromagnetic field at microwave frequency. The resulting plasma-chemical reactions may incorporate carbon into the germanium material 2, forming the germanium carbide layer 4. The germanium material 2 may be carburized in a MPECVD system. MPECVD systems are known in the art and are commercially available from numerous sources, such as from Applied Materials (Santa Clara, Calif.) or Wavemat Inc. (Plymouth, Mich.). As such, MPECVD systems are not described in detail herein. For the sake of example only, the MPECVD system may be an Applied Materials single wafer system model 5000, which is available from Applied Materials (Santa Clara, Calif.).

Before forming the germanium carbide layer 4, the semiconductor device having the germanium material 2 may be cleaned or degreased to remove germanium oxide and other impurities present on its surface. To remove the impurities, the germanium material 2 may be etched with an etch solution, such as a mixture of nitric acid and hydrofluoric acid, followed by quenching with methanol. Since germanium oxide is soluble in water, the semiconductor device may also be rinsed with deionized water to remove any germanium oxide that may be present on the germanium material 2.

After cleaning, the semiconductor device may be placed in a reactor chamber of the MPECVD system, which is initially maintained at a low temperature, such as approximately 300° C. However, this initial temperature may vary, depending on the dimensions of the germanium substrate or the germanium layer. The reactor chamber may be initially evacuated to a pressure on the order of approximately $10^{-4}$ mTorr or approximately $10^{-5}$ mTorr. To carburize the germanium material 2, the temperature in the MPECVD system may be quickly increased and the pressure may be increased to less than or equal to approximately 2 Torr. As described below, the temperature and pressure changes produce a microwave generated plasma 6 to which the semiconductor device may be exposed. During the carburization, the MPECVD system may be maintained at a temperature that ranges from approximately 800° C. to approximately 1200° C., such as approximately 1000 C.°. Within this range, a higher temperature may be used when a relatively faster rate of forming the germanium carbide layer 4 is desired, while a low temperature within the range may be used to achieve a relatively slower rate of formation.

The microwave generated plasma 6 may be produced by introducing hydrogen and a source gas into the MPECVD system and exposing the hydrogen and source gas to energy having a frequency within the microwave range, such as energy having a wavelength that ranges from approximately 1 mm to approximately 30 cm (from approximately $1 \times 10^9$ Hz to approximately $1 \times 10^{11}$ Hz). The source gas may be a carbon-containing gas, such as ethylene, acetylene, ethanol, a hydrocarbon gas having from one to ten carbon atoms per molecule, or mixtures thereof. The hydrocarbon gas may include, but is not limited to, methane, ethane, propane, butane, etc., or mixtures thereof. A rate of forming the germanium carbide layer 4 may be affected by relative amounts of the source gas and the hydrogen used in the MPECVD system. The greater the amount of source gas relative to the amount of hydrogen, the faster the rate at which the germanium carbide layer 4 may be formed. Therefore, to form the germanium carbide layer 4 at a relatively faster rate, a larger amount of the source gas may be used relative to the amount of hydrogen. For instance, a high hydrogen dilution ratio may be used, such as on the order of 50:1.

The amount of source gas relative to the amount of hydrogen may also affect the carbon content of the resulting germanium carbide layer 4. Therefore, by adjusting the amount of the source gas that is used, the amount of carbon incorporated into the germanium material 2 may be controlled. The resulting germanium carbide layer 4 may range from being germanium rich (carbon poor) to carbon rich (germanium poor). For instance, the germanium carbide layer 4 may be $Ge_{0.9}C_{0.1}:H$, $Ge_{0.1}C_{0.9}:H$, or a material having a germanium and carbon content that falls in between $Ge_{0.9}C_{0.1}:H$ and $Ge_{0.1}C_{0.9}:H$. Since electrical and optical properties of the semiconductor device are determined by the amount of carbon in the germanium carbide layer 4, properties of the germanium carbide layer 4 may be tailored by incorporating a desired amount of carbon into the germanium carbide layer 4. For instance, the band gap, electron affinity, or electron barrier energy of the germanium carbide layer 4 may depend on the carbon content of the germanium carbide layer 4. By increasing the amount of carbon in the germanium carbide layer 4, the band gap of the material may be increased and the electron affinity may be decreased. In one embodiment, the germanium carbide layer 4 includes substantially equal amounts of germanium and carbon, i.e. $x=0.5$ in $Ge_xC_{1-x}:H$.

A flow rate of the hydrogen and the source gas may also be adjusted to control the amount of carbon incorporated into the germanium material 2. For instance, each of the hydrogen and the source gas may be introduced into the MPECVD system at a flow rate that ranges from approximately 100 standard cubic centimeters per minute ("sccm") to approximately 1000 sccm. To increase the carbon content in the germanium carbide layer 4, a relatively higher flow rate of the source gas to hydrogen within this range may be used.

The frequency of energy used to carburize the germanium material 2 may depend on the dimensions of the germanium material 2 that is used. For the sake of example only, if the germanium material 2 is an 8 inch to 10 inch germanium wafer, a microwave power of approximately 1,000 watts may be used. However, if the substrate or layer of germanium material 2 is smaller, such as a 3 inch to 4 inch germanium wafer, a lower microwave power may be used, such as a power that ranges from approximately 250 watts to approximately 300 watts.

To carburize the germanium material 2, the semiconductor device having the germanium material 2 may be immersed in the microwave generated plasma 6. For instance, the semiconductor device may be immersed approximately 0.5 cm into the microwave generated plasma 6. Upon contact with the microwave generated plasma 6 for a sufficient amount of time, carbon may be incorporated into the germanium material 2, forming the germanium carbide layer 4. The amount of time needed to form the germanium carbide layer 4 may depend on a desired thickness of the germanium carbide layer 4 that is ultimately to be formed. The thickness of the germanium carbide layer 4 deposited by MPECVD may lie within a range of from approximately 10 Å to approximately 500 Å. The germanium carbide layer 4 having a thickness of approximately 10 Å may be deposited in approximately one minute, while the germanium carbide layer 4 having a thickness of approximately 500 Å may be deposited in approximately one hour. Since the formation of the germanium carbide layer 4 is a diffusion-limited process, a germanium carbide layer 4 having a thickness at the high end of this range may require a longer time and a higher temperature to produce. The carbon may be substantially uniformly incorporated into the germanium material 2. As such, no carbon gradient may be present in the germanium carbide layer 4.

The germanium carbide layer 4 formed by the method of the present invention may be used to passivate a surface of the germanium material 2, preventing impurities or dopants from penetrating into the underlying germanium material 2 and providing mechanical protection and electrical insulation. The germanium carbide layer 4 is equivalent in performance as a surface passivation to silicon dioxide grown on a silicon substrate. The germanium carbide layer 4 may passivate the underlying germanium material 2 without negatively affecting the optical and electrical properties of the germanium material 2 and without introducing mechanical strain into the germanium material 2. As such, the passivated, germanium material 2 may be used in a wide variety of semiconductor devices including, but not limited to, transistors (bipolar or FET) or optoelectronic devices, such as photodetectors, light emitters, infrared emitters, or photodiodes. FETs are used in programmable logic arrays ("PLAs") or memory devices, such as in erasable programmable read only memory ("EPROM"), electrically erasable and programmable read only memory ("EEPROM"), electronically alterable programmable read only memory ("EEPROM"), dynamic random access memory ("DRAM"), synchronous dynamic random access memory ("SDRAM"), SyncLink dynamic random access memory ("SLDRAM"), RAMBUS dynamic random access memory ("RDRAM"), or flash memory devices. FETs are used as both access transistors and as memory elements in flash memory devices. The germanium carbide layer 4 may also function as an insulating, or dielectric, layer in the semiconductor device.

The germanium carbide layer 4 may provide good passivation of the germanium material 2. Without being tied to a particular theory, it is believed that using MPECVD to form the germanium carbide layer 4 enables electron bonds to continue across an interface between the germanium material 2 and the germanium carbide layer 4 as the germanium carbide layer 4 is formed. As such, substantially no grain boundary forms between the germanium material 2 and the resulting germanium carbide layer 4. Therefore, no perceptible or distinct boundary forms at the interface between the germanium material 2 and the germanium carbide layer 4. In contrast, when germanium carbide is formed by a conventional technique, such as by RF reactive sputtering or ECR plasma processing, a perceptible boundary forms at the interface between the underlying material and the germanium carbide layer. Since RF reactive sputtering and ECR plasma processing are deposition techniques, a distinct layer of germanium carbide is formed over the underlying layer. In other words, electron bonds do not form across the interface between the underlying layer and the germanium carbide layer, producing the boundary between the two layers and resulting in a relatively weak bond between the two.

Figure 5:
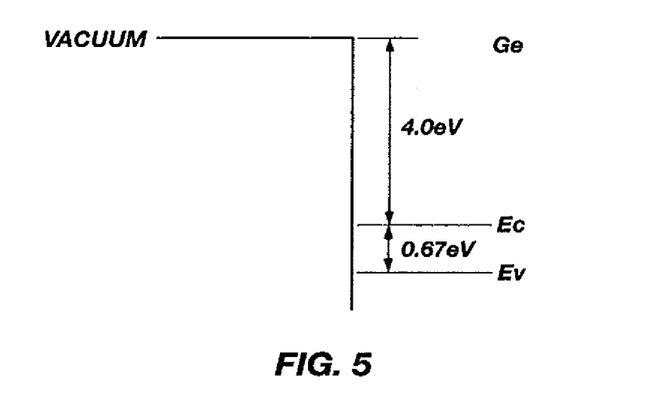
FIG. 5 is a band diagram for germanium.
Figure 6:
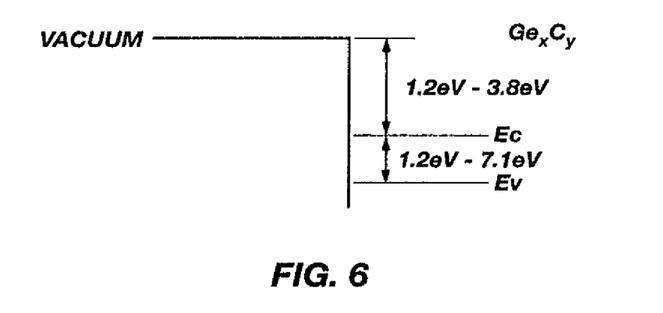
FIG. 6 is a band diagram for germanium carbide.
Figure 7:
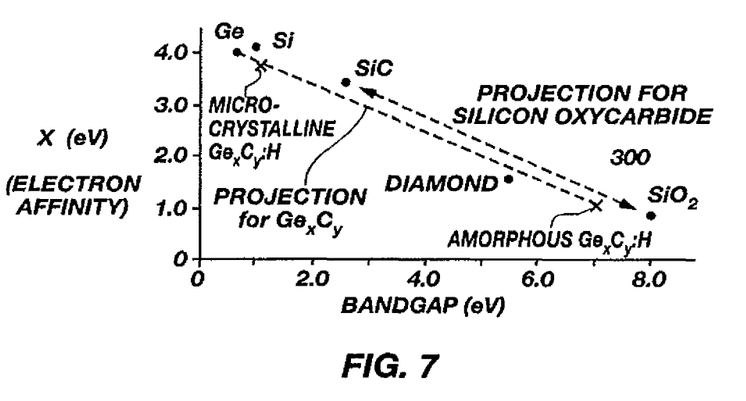
FIG. 7 shows band gap energies and electron affinities of silicon carbide and germanium carbide.
Figure 8:
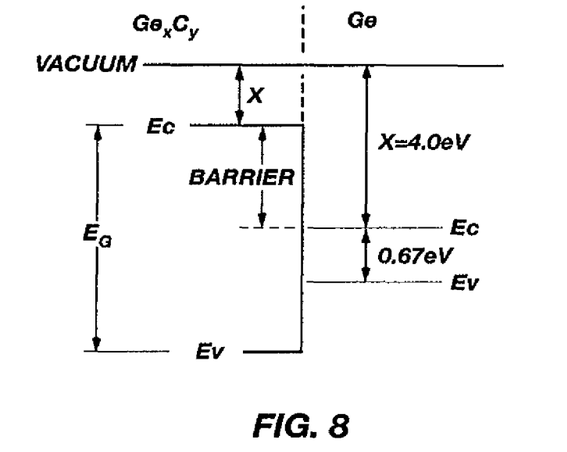
FIG. 8 is a band diagram for germanium carbide on a germanium substrate.

The band gap energies and electron affinities of germanium and germanium carbide are shown in FIGS. 5 and 6, respectively. The band gap energy of germanium is 0.67 eV and the electron affinity is 4.0 eV. The band gap energy of germanium carbide ranges from 1.2 eV to 7.1 eV and the electron affinity ranges from 1.2 eV to 3.8 eV. Possible band gap energies and electron affinities of the germanium carbide are shown in FIG. 7. For comparison, band gap energies and electron affinities of amorphous $Ge_xC_y$:H produced by plasma assisted CVD, as described in Tyczkowski et al., and microcrystalline $Ge_xC_y$:H produced by ECR, as described in Herrold et al. (both of which are described above), are also shown. FIG. 8 shows the band gap energy and electron affinity of a germanium carbide layer on a germanium substrate. The germanium carbide layer on a germanium substrate may have an electron barrier energy of up to approximately 2.8 eV. As such a germanium carbide layer formed by MPECVD may be suitable for passivating a germanium substrate or a layer of germanium material. Forming a germanium carbide layer by MPECVD may also result in a lower risk of producing undesirable microcrystalline inclusions. In addition, the resulting germanium carbide layer may have a lower surface state density than germanium carbide formed by conventional deposition techniques. Growth of the amorphous germanium carbide layer may enable completion of electronic bonds across the interface between the germanium material 2 and the germanium carbide layer 4.

Since forming the germanium carbide layer 4 by MPECVD, as illustrated in FIG. 1, is a slow process, conventional techniques may be used to increase the initial thickness of the germanium carbide layer 4 formed by MPECVD. The thickness of the germanium carbide layer 4 may be further increased, if desired, to achieve complete passivation of the germanium material 2. The thickness of the initial germanium carbide layer 4 may be increased by depositing amorphous germanium carbide by a conventional technique, such as by RF reactive sputtering or ECR plasma processing. A total thickness of the resulting germanium carbide layer may lie within a range of from approximately 50 Å to approximately 5000 Å. Alternatively, another amorphous dielectric material, such as amorphous silicon oxide, may be formed on the germanium carbide layer 4 to increase its thickness. However, if only a relatively thin germanium carbide layer 4 is desired, the entire thickness of the germanium carbide layer 4 may be formed by MPECVD.

Figure 9:
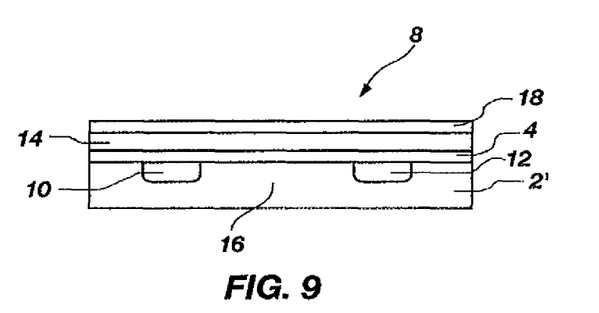
FIG. 9 is a cross-sectional view of an embodiment of an intermediate structure of an n-channel FET that includes a germanium carbide layer as a passivation layer.

As previously mentioned, the germanium carbide layer 4 may be present in a semiconductor device structure, such as an FET, as a passivation layer for a germanium material 2. An intermediate structure 8 of an n-channel FET is shown in FIG. 9. The methods and intermediate structures described herein do not form a complete process flow for manufacturing the semiconductor device. However, the remainder of the process flow is known to a person of ordinary skill in the art. Accordingly, only the process acts and semiconductor structures necessary to understand the present invention are described herein. The intermediate semiconductor device structure 8 may include a source region 10, a drain region 12, and a gate region 14. The source region 10 and the drain region 12 may be fabricated by conventional techniques, such as by forming regions of highly doped ($n^+$) regions in a lightly doped ($p^-$) germanium substrate 2'. Alternatively, the source region 10 and the drain region 12 may be fabricated in a semiconductor substrate, such as a silicon substrate, having a germanium layer on its top surface. The source region 10 and the drain region 12 may be separated by a predetermined length in which a channel region 16 is formed. The gate region 14 may be formed by conventional techniques from conventional materials. A conductive layer 18, formed from polysilicon or a metal, may be formed over the gate region 14. For instance, the conductive layer 18 may be formed from polycrystalline silicon that is highly doped and annealed to increase its conductivity. The gate region 14, the conductive layer 18, and subsequently formed, overlying layers may be etched, as known in the art, to produce the n-channel FET. The subsequently formed, overlying layers may be formed from insulating materials, as known in the art, to produce the semiconductor device structure.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A semiconductor device structure, comprising:
   a substrate having, at least formed on its top surface, a germanium material and an amorphous germanium carbide material having the composition $Ge_xC_{1-x}$:H, where 0 is less than x and x is less than 1, wherein the amorphous germanium carbide material is in contact with at least a portion of the germanium material and wherein the germanium material and the amorphous germanium carbide material are formed on the top surface of the substrate;
   a source region formed in the germanium material;
   a drain region formed in the germanium material; wherein the source and drain regions are separated by a channel region; and
   a gate region formed over the amorphous germanium carbide material over which is formed a conductive layer.

2. The semiconductor device structure of claim 1, wherein the germanium material comprises a germanium substrate or a substrate comprising at least one other material and having a germanium material on a surface thereof.

3. The semiconductor device of claim 1 wherein the substrate is selected from the group consisting of a silicon wafer, a silicon on insulator substrate, a silicon on glass substrate, a silicon on sapphire substrate, an epitaxial layer of silicon on a base semiconductor foundation, a silicon-germanium substrate, a gallium arsenide substrate, and an indium phosphide substrate.

4. The semiconductor device structure of claim 1, wherein the amorphous germanium carbide material comprises approximately equal amounts of germanium and carbon.

5. The semiconductor device structure of claim 1, wherein x is about 0.5.

6. The semiconductor device structure of claim 1, wherein an interface between the amorphous germanium carbide material and the germanium material is substantially free of a distinct boundary.

7. The semiconductor device structure of claim 1, wherein the germanium carbide material has a thickness within a range of from approximately 10 Å to approximately 500 Å.

8. A semiconductor device comprising:
   a substrate comprising a germanium material formed at least on the top surface of the substrate;
   an amorphous germanium carbide material having the composition $Ge_xC_{1-x}$:H, where x is greater than 0 and less than 1 and wherein the amorphous germanium carbide material is in contact with at least a portion of the germanium material; and
   at least one integrated circuit on a surface of a semiconductor device structure.

9. The semiconductor device of claim 8 further comprising:
   a source region formed in the germanium material and a drain region formed in the germanium material, wherein the source and drain regions are separated by a channel region; and
   a gate region formed over the amorphous germanium carbide material over which is formed a conductive layer.

10. The semiconductor device of claim 8 wherein the germanium material comprises a germanium substrate or a substrate comprising at least one other material and having a germanium material on a surface thereof.

11. The semiconductor device of claim 8, wherein the substrate comprises at least one other material and having a germanium material on a surface thereof is selected from the group consisting of a silicon wafer, a silicon on insulator substrate, a silicon on glass substrate, a silicon on sapphire substrate, an epitaxial layer of silicon on a base semiconductor foundation, a silicon-germanium substrate, a gallium arsenide substrate, and an indium phosphide substrate.

12. The semiconductor device of claim 8, wherein the semiconductor device structure is substantially free of a grain boundary between the germanium material and the germanium carbide material.

13. The semiconductor device of claim 8, wherein an interface between the germanium carbide material and the germanium material is substantially free of a distinct boundary.

14. The semiconductor device of claim 8, wherein the amorphous germanium carbide material has a thickness within a range of from approximately 10 Å to approximately 500 Å.

15. The semiconductor device of claim 8, wherein the semiconductor device structure comprises a field effect transistor.

16. A semiconductor device structure, comprising:
   a substrate having, formed on its top surface, a germanium material and an amorphous passivated surface having the composition $Ge_xC_{1-x}$:H, wherein x is greater than zero and less than 1, wherein the amorphous passivated surface is in contact with at least a portion of the germanium material, and wherein the germanium material and the amorphous germanium carbide material are formed on the top surface of the substrate;
   a source region formed in the germanium material;

a drain region formed in the germanium material; wherein the source and drain regions are separated by a channel region; and
a gate region formed over the amorphous germanium carbide material over which is formed a conductive layer;
a germanium material and an amorphous germanium carbide material having the composition $Ge_xC_{1-x}$:H wherein x is greater than zero and less than 1 and wherein the amorphous germanium material is in contact with at least a portion of the germanium material.

* * * * *